United States Patent
Nowicki

(10) Patent No.: US 7,346,815 B2
(45) Date of Patent: Mar. 18, 2008

(54) MECHANISM FOR IMPLEMENTING REDUNDANCY TO MASK FAILING SRAM

(75) Inventor: Marcin Nowicki, Austin, TX (US)

(73) Assignee: Intel Corporation, Santa Clara ( * ) Notice: Subject to any disclaimer, the term of this patent is extended or adjusted under 35 U.S.C. 154(b) by 261 days.

(21) Appl. No.: 11/096,978

(22) Filed: Mar. 31, 2005

(65) Prior Publication Data

US 2006/0224933 A1    Oct. 5, 2006

(51) Int. Cl.
*G11C 29/00*    (2006.01)
*G11C 7/00*    (2006.01)

(52) U.S. Cl. ............... 714/710; 714/723; 365/201

(58) Field of Classification Search ........ 714/710–711, 714/718–724
See application file for complete search history.

(56) References Cited

U.S. PATENT DOCUMENTS 5,758,056 A * 5/1998 Barr .............................. 714/7
6,182,257 B1 * 1/2001 Gillingham ................. 714/733
6,243,307 B1 * 6/2001 Kawagoe ..................... 365/201
6,732,229 B1 * 5/2004 Leung et al. ............... 711/109
2005/0240838 A1 * 10/2005 Iwai ............................ 714/718

* cited by examiner

*Primary Examiner*—Cynthia Britt
(74) *Attorney, Agent, or Firm*—Blakley, Sokoloff, Taylor & Zafman LLP

(57) ABSTRACT

In some embodiments, an apparatus to implement redundancy for failure masking in memory is disclosed. The apparatus comprises a built-in self test (BIST) log to store BIST data representing faulty columns of a memory, a redundancy configuration logic to generate one or more select signals based on the BIST data, an input shifter to map input data to one or more redundant columns of the memory, based on the one or more select signals, to avoid the faulty columns, and an output shifter to map output data from the one or more redundant columns of the memory, based on the one or more select signals, by bypassing the faulty columns. In one embodiment the memory is a static random access memory (SRAM). Other embodiments are also described.

19 Claims, 9 Drawing Sheets ized memory (SRAM).

MECHANISM FOR IMPLEMENTING REDUNDANCY TO MASK FAILING SRAM

FIELD OF THE INVENTION

The embodiments of the invention relate generally to the field of computer architecture and, more specifically, relate to a mechanism to implement redundancy for failure masking in a memory, such as a static random access memory (SRAM).

BACKGROUND

Many portable and battery-operated devices are designed so that embedded SRAMs in the devices will operate at low voltages. A small percentage of SRAM bits in these devices may be prone to malfunction due to aging of the circuit in which the SRAM resides. Furthermore, the malfunctions may change based on consumer usage patterns (e.g., utilizing a significant amount of power) and the environment in which the system operations (e.g., temperature of the surrounding area, etc.).

One approach to mask errors based on these malfunctions in a SRAM is to use Error Correction Code (ECC). ECC is used to protect against different physical phenomena that may negatively affect systems that need to function without outages. The implementation of ECC for memory designs is expensive and may create additional problems related to timing.

A SRAM product that leaves the factory without defects may later experience intermittent failures or glitches due to the aging or environment. Masking such failures or glitches in the functioning of a SRAM allows it to function correctly throughout its lifetime despite the presence of a small number of errors in the SRAM. It is important for mobile products, such as laptops, where consumers do not generally upgrade systems, to be able to operate in the presence of such errors.

One mechanism to assist a product in operating in the presence of errors in SRAM is to utilize redundancy in the SRAM to mask failures. In some conventional designs of SRAM, redundancy is introduced at manufacturing into large SRAMs to mask manufacturing errors and increase yield. However, such redundancy may not be able to be reconfigured during the lifetime of the SRAM. Also, many designs have hundreds of small SRAMs, and configuring redundancy at manufacturing to mask failures due to aging and the environment may be impossible in some cases.

BRIEF DESCRIPTION OF THE DRAWINGS

The invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A method and apparatus to implement redundancy for failure masking in a memory, such as a static random access memory (SRAM), are presented. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the embodiments of the invention may be practiced without these specific details. In other instances, well-known structures and devices are shown in block diagram form, rather than in detail, in order to avoid obscuring the invention.

Figure 1B:
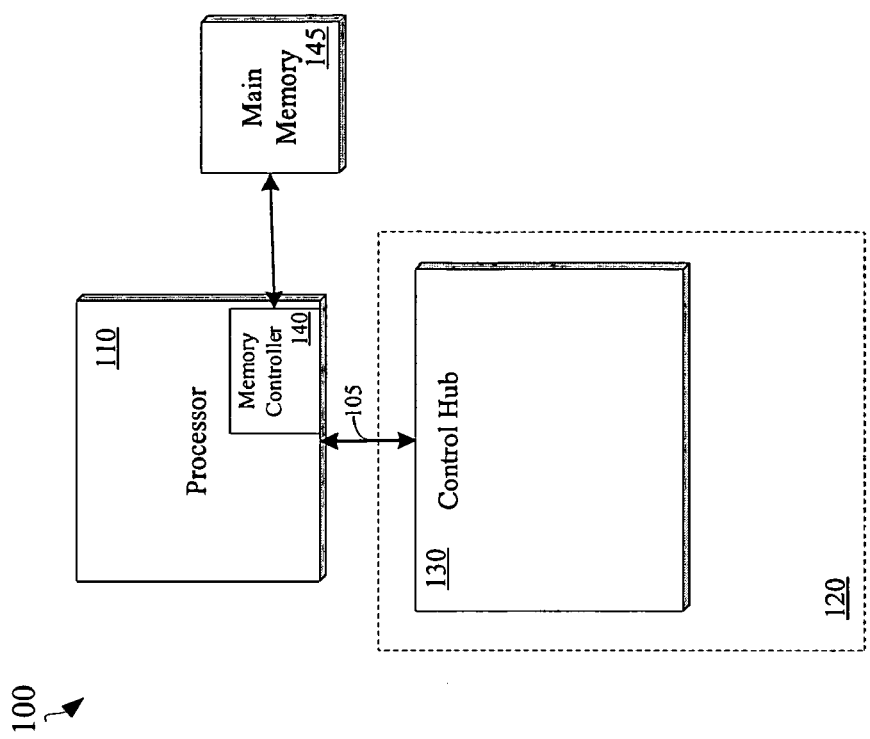
FIG. 1 illustrates a block diagram of one embodiment of a computer system.
Figure 1A:
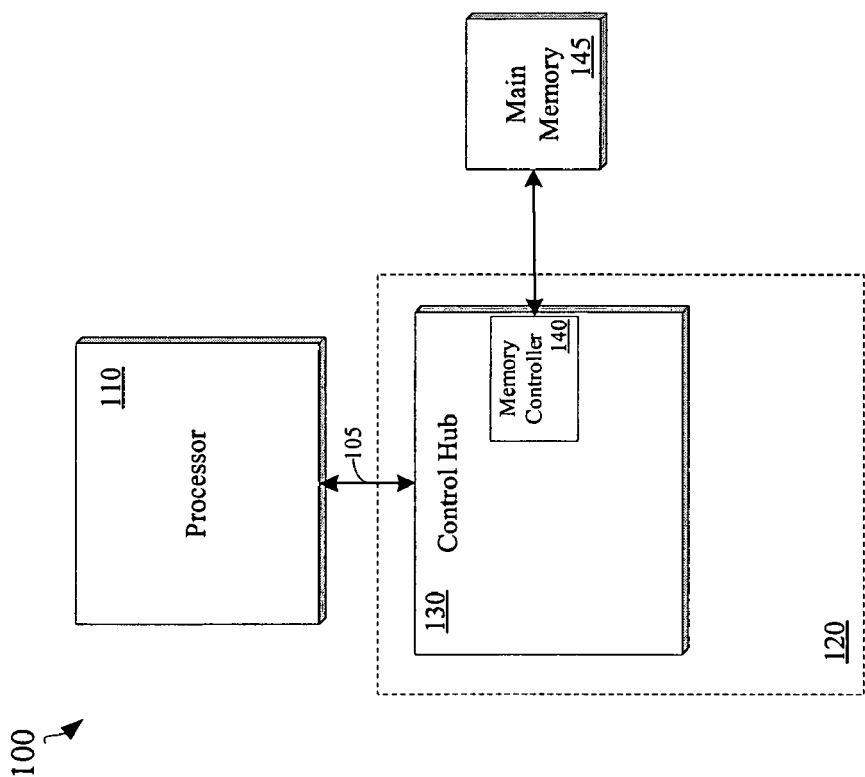

FIGS. 1A and 1B illustrate a block diagram of one embodiment of a computer system 100. Computer system 100 includes a processor 110 coupled to an interface 105. In some embodiments, the terms processor and central processing unit (CPU) may be used interchangeable. In one embodiment, processor 110 is a processor in the Pentium® family of processors including the Pentium® IV processors available from Intel Corporation of Santa Clara, Calif. Alternatively, other processors may be used. In a further embodiment, processor 110 may include multiple processor cores.

According to one embodiment, interconnect 105 communicates with a control hub 130 component of a chipset 120. In some embodiments, interconnect 105 may be point-to-point or, in other embodiments may be connected to more than two chips. Control hub 130 includes a memory controller 140 that is coupled to a main system memory 145, as depicted in FIG. 1A. In other embodiments, memory controller 140 may be in the same chip as processor 110, as depicted in FIG. 1B.

In some embodiments, the memory controller 140 may work for all cores or processors in the chip. In other embodiments, the memory controller 140 may include different portions that may work separately for different cores or processors in the chip.

Main system memory 145 stores data and sequences of instructions and code represented by data signals that may be executed by processor 110 or any other device included in computer system 100. In one embodiment, main system memory 145 includes static random access memory (SRAM); however, main system memory 145 may be implemented using other memory types. In a further embodiment, memory, such as SRAM, may be located on the control hub 130 itself. According to one embodiment, control hub 130 also provides an interface to input/output (I/O) devices within computer system 100.

Figure 2:
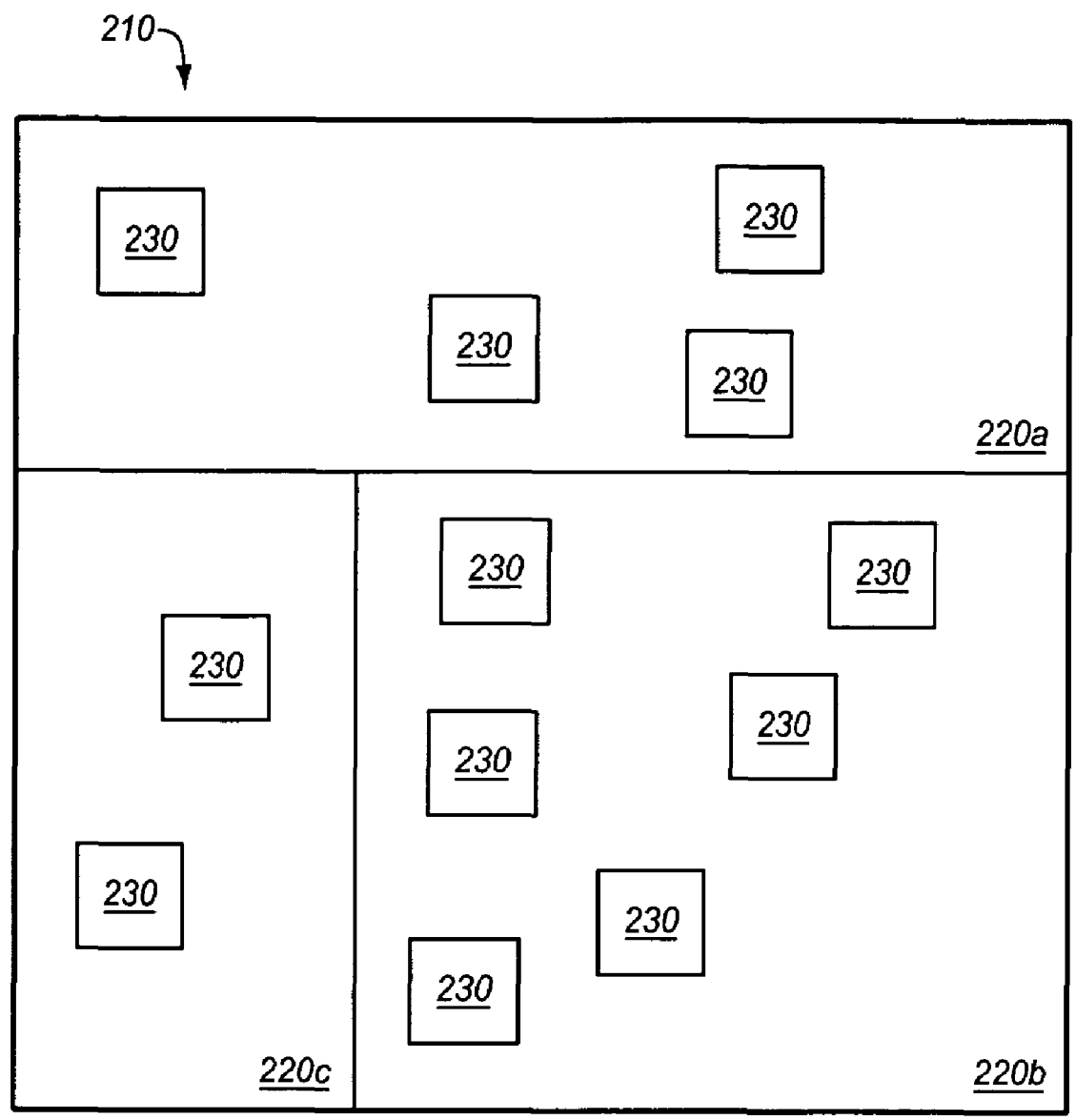
FIG. 2 illustrates a block diagram of a memory controller including a plurality of SRAMs.

FIG. 2 is block diagram of one embodiment of memory controller that includes one or more SRAMs that implement redundancy, as described below. Memory controller 210 may be the same as memory controller 140 as depicted in FIGS. 1A and 1B. In one embodiment, memory controller 210 may contain one or more power wells 220a-c. Power wells 220a, 220b, 220c are portions of the memory controller 210 where different and possibly changing voltages may be applied. In some embodiments, there may be more or less than three power wells (as shown) within the memory controller 210. Each power well 220a-c includes one or more instances of SRAM 230. In some embodiments, power wells 220a-c may hold hundreds of SRAMs, each SRAM implementing redundancy, as described below.

Embodiments of the invention utilize hardware to dynamically reconfigure one or more SRAMs with redundancy to mask failures in the SRAM. Such reconfiguration may be requested by the computer system due to aging or environmental effects on the SRAM. In some embodiments, memory types other than SRAM may implement the redundancy to mask failures as described below. One skilled in the art will appreciate that embodiments of the invention are not necessarily limited to implementation with SRAM.

Redundancy is introduced by utilizing spare columns of memory in a SRAM. Embedded redundancy in the spare columns of a SRAM allows for masking of malfunctions of "weakest bits" in the SRAM. A SRAM with a structure of N+M columns (where N is number of bits to store in SRAM and M is the number of spare columns) may be configured with redundancy by mapping N input bits to the fault-free N columns of SRAM and ignoring the M spare columns. Built-in self-test (BIST) and redundancy configuration logic may be utilized to configure the redundancy in SRAM.

Figure 3:
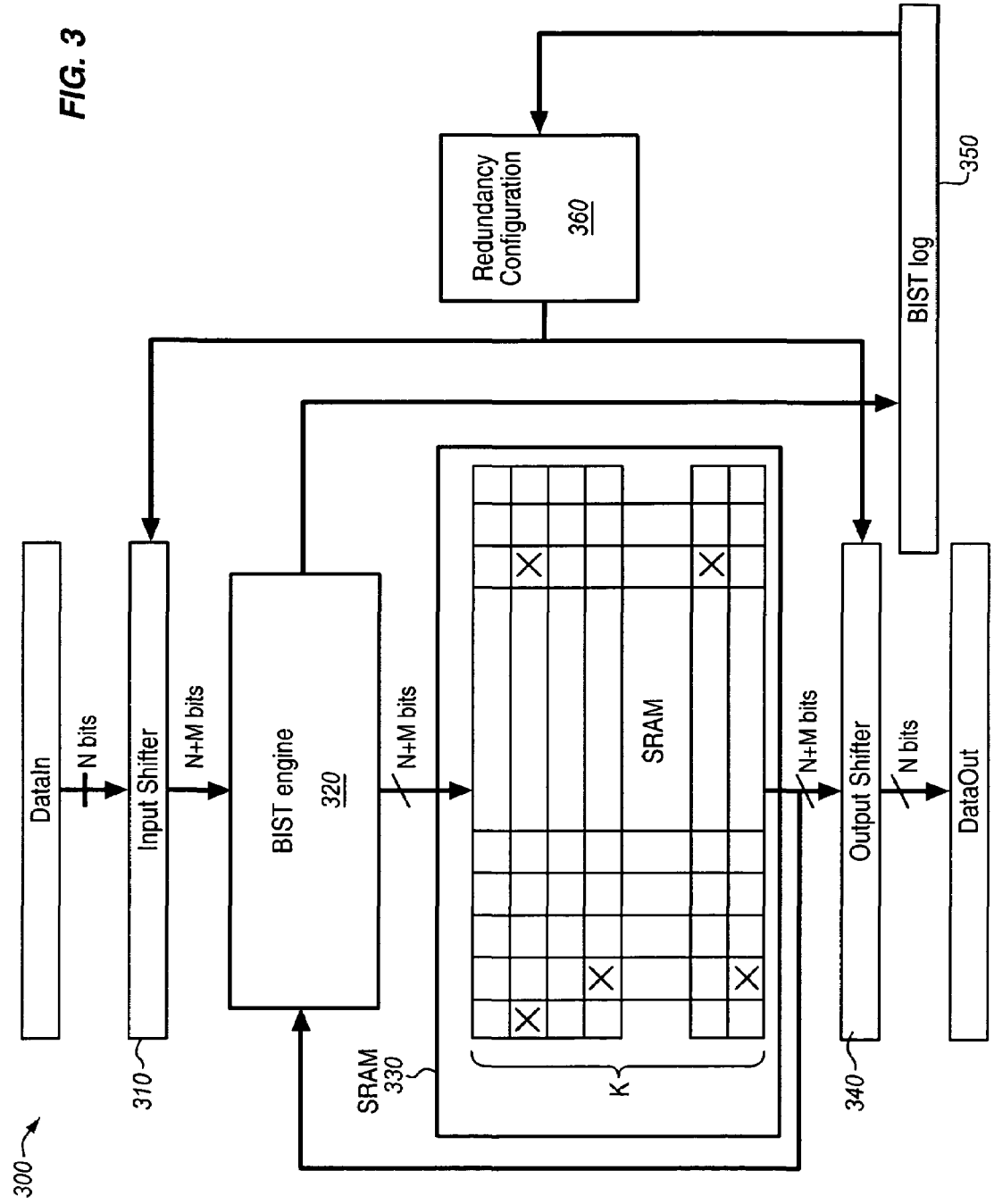
FIG. 3 illustrates a block diagram of one embodiment of a SRAM with redundancy.

Referring now to FIG. 3, a block diagram of a SRAM implementing redundancy, is shown. The apparatus 300 includes an input shifter 310, a BIST engine 320, a SRAM 330, an output shifter 340, a BIST log 350, and redundancy configuration logic 360.

The SRAM 330 includes a functional portion with K entries of N bits, and a redundant portion capable of masking M "weak bits". Redundancy in the SRAM 330 is introduced by producing M spare columns in the SRAM 330 to account for at least M "weak bits." Accordingly, the SRAM 330 may include N+M columns and K entries when manufactured.

Also included in the apparatus 300 is a BIST engine 320 that is capable of testing the whole SRAM 330 (N+M bits in all K entries). During the BIST engine 320 operation, the contents of the N+M BIST log 350 are generated. Bit j j=1 . . . N+M) in the BIST log 350 is set only if bit j in any pattern applied to SRAM 330 failed the BIST. If a bit fails the BIST, then the entire column the bit resides in is marked as faulty. In one embodiment, the BIST log 350 may be a register to store the data representing faulty columns (e.g., "0" and "1" values) of the SRAM 330.

The BIST log 350 data is processed by redundancy configuration logic 360, and further used as inputs to input shifter 310 and output shifter 340 to configure the SRAM 330 redundancy. Input shifter 310 operates to map data to columns of SRAM 330 that are not marked faulty, while output shifter 340 operates to map data to output data from columns in SRAM that are not faulty.

Figure 4:
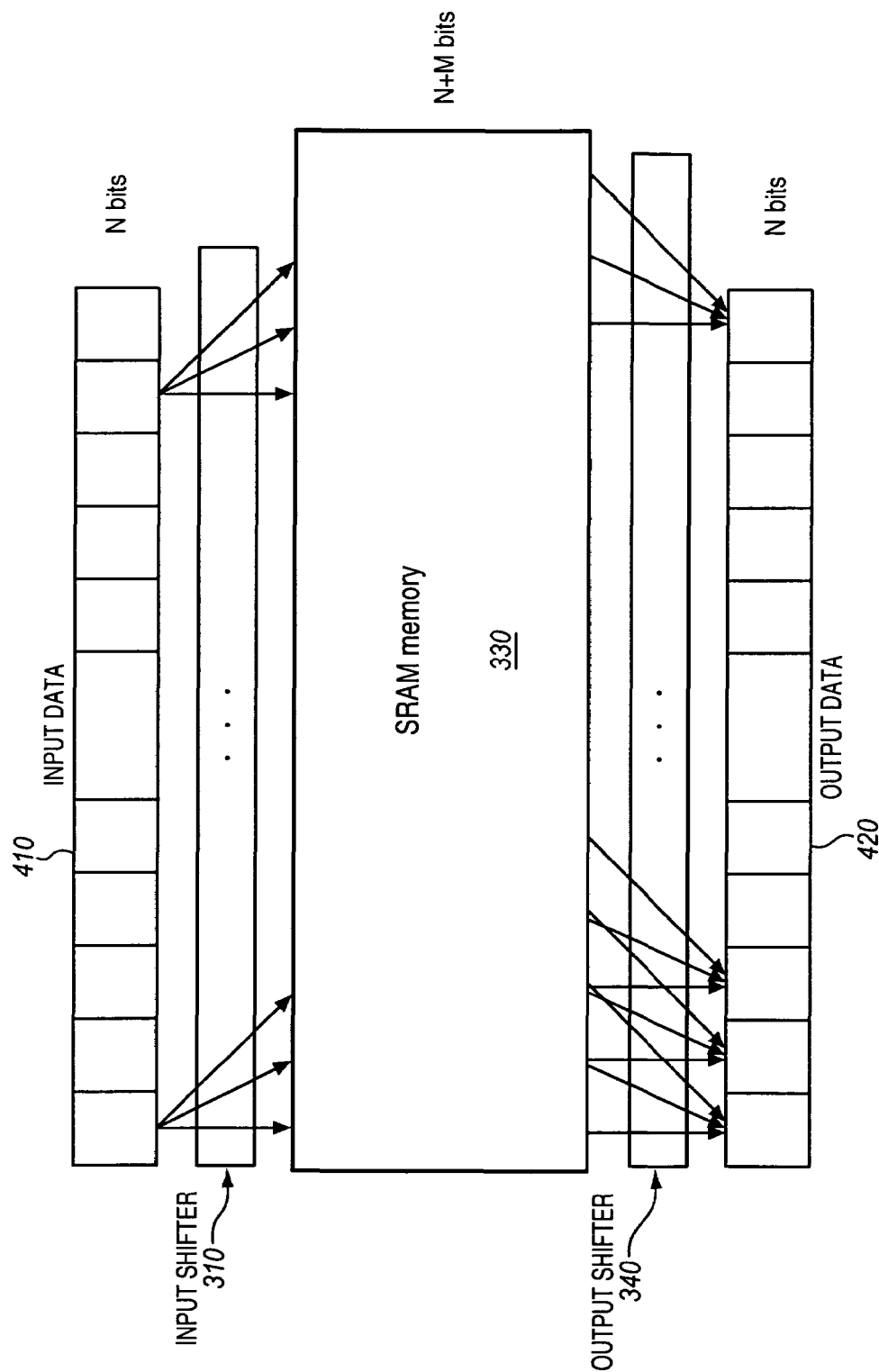
FIG. 4 illustrates a block diagram of one embodiment of an input shifter and an output shifter.

Referring now to FIG. 4, a block diagram of one embodiment of the conceptual operation of an input shifter 310 and an output shifter 340 in relation to a SRAM 330, is shown. In one embodiment, the input shifter 310, output shifter 340, and SRAM 330 are the same as depicted in FIG. 3. The function of the input shifter 310 is to map N bits of input data 410 to N+M bits in SRAM 330. The function of output shifter 340 is to map N+M bits coming of SRAM 330 to N bits of output data 420.

In some embodiments, both input 310 and output 340 shifters have a similar structure, as described below. Both shifters 310, 340 utilize multiplexers to select and shift the data to its location. However, the shifters 310, 340 differ in the number of inputs and outputs to each and the number of multiplexers utilized in each shifter 310, 340.

Figure 5:
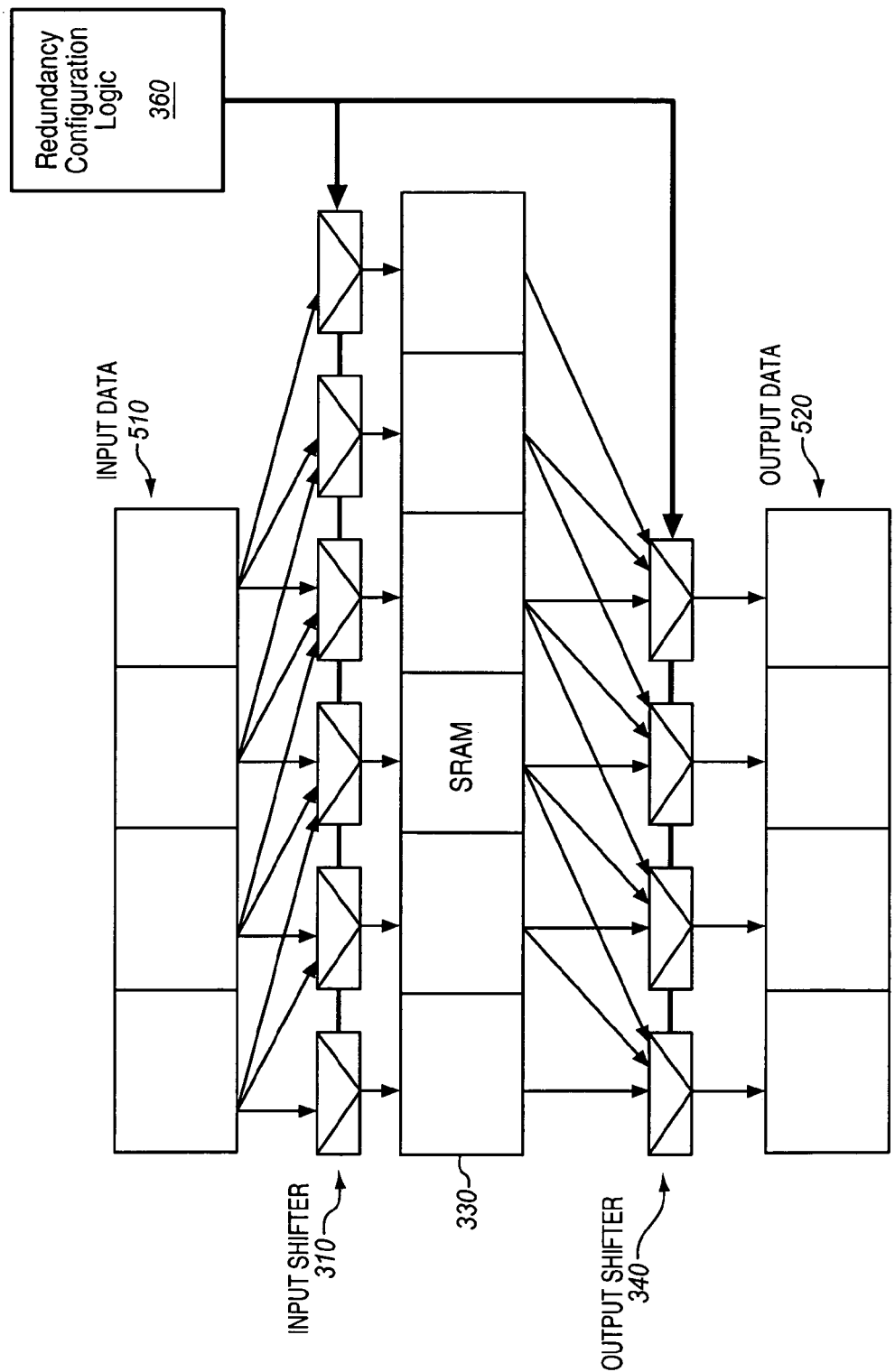
FIG. 5 illustrates a block diagram of one embodiment of an example implementation of an input shifter and an output shifter.

Referring to FIG. 5, a block diagram illustrating one embodiment of an example implementation of an input shifter and an output shifter, is shown. In one embodiment, SRAM 330 includes N+M columns, where N=4 bit data entry with M=2 redundancy. In one embodiment, an input shifter 310 maps N bits of input data 510 to a N+M vector going to the SRAM 330. Input shifter 310 maps input data 510 based on data received from redundancy configuration logic 360, which determines its data based on BIST log data.

The mapping by input shifter 310 bypasses certain positions of a destination vector in SRAM 330 that refer to faulty columns in SRAM. The faulty columns are determined by the information maintained in a BIST log. In one embodiment, input shifter 310 logic is implemented by multiplexers with a fan-in value equal to up to M+1 data bits, where M is the number of redundant columns of the SRAM 330.

For example, assume that N=4, M=2 (as shown in FIG. 5) and the BIST log data is set to values: 0 1 0 0 1 0. In this case, input data, [b0] [b1] [b2] [b3], will be mapped by the input shifter 310 to a N+M=6 bit vector of the SRAM 330 in the following manner: [b0] [X] [b1] [b2] [X] [b3], where X represents a column of SRAM that may be disregarded. The BIST log value of 1 informs the input shifter 310 to avoid mapping input data 510 to the second and fifth columns of the SRAM vector, which a BIST has determined are faulty. In one embodiment, each multiplexer of input shifter 310 receives M+1, or 3 bits, of data from which to select an output.

Continuing to refer to FIG. 5, output shifter 340 maps N+M bits of data coming out of SRAM 330 to N bits of output data 520. As with input shifter 310, output shifter 340 maps to output data 520 based on data received from the redundancy configuration logic 360, which determines its data based on BIST log data. The mapping by output shifter 340 bypasses those positions of a destination vector that refer to faulty columns in the SRAM 330, as determined by a BIST.

For example, assume that N=4 and M=2 (as shown in FIG. 5), and BIST log is set to value: 0 1 0 0 1 0. In this case, the SRAM 330 N+M vector containing data: [s0] [s1] [s2] [s3] [s4] [s5] will be mapped by output shifter 340 to output data 520 with the following data: [s0] [s2] [s3] [s5]. The BIST log value of 1 informs the output shifter 340 to disregard the data in the second and fifth columns, which a BIST has determined are faulty. In one embodiment, output shifter 340 logic is implemented by multiplexers with a fan-in value equal to M+1 data bits.

Figure 6:
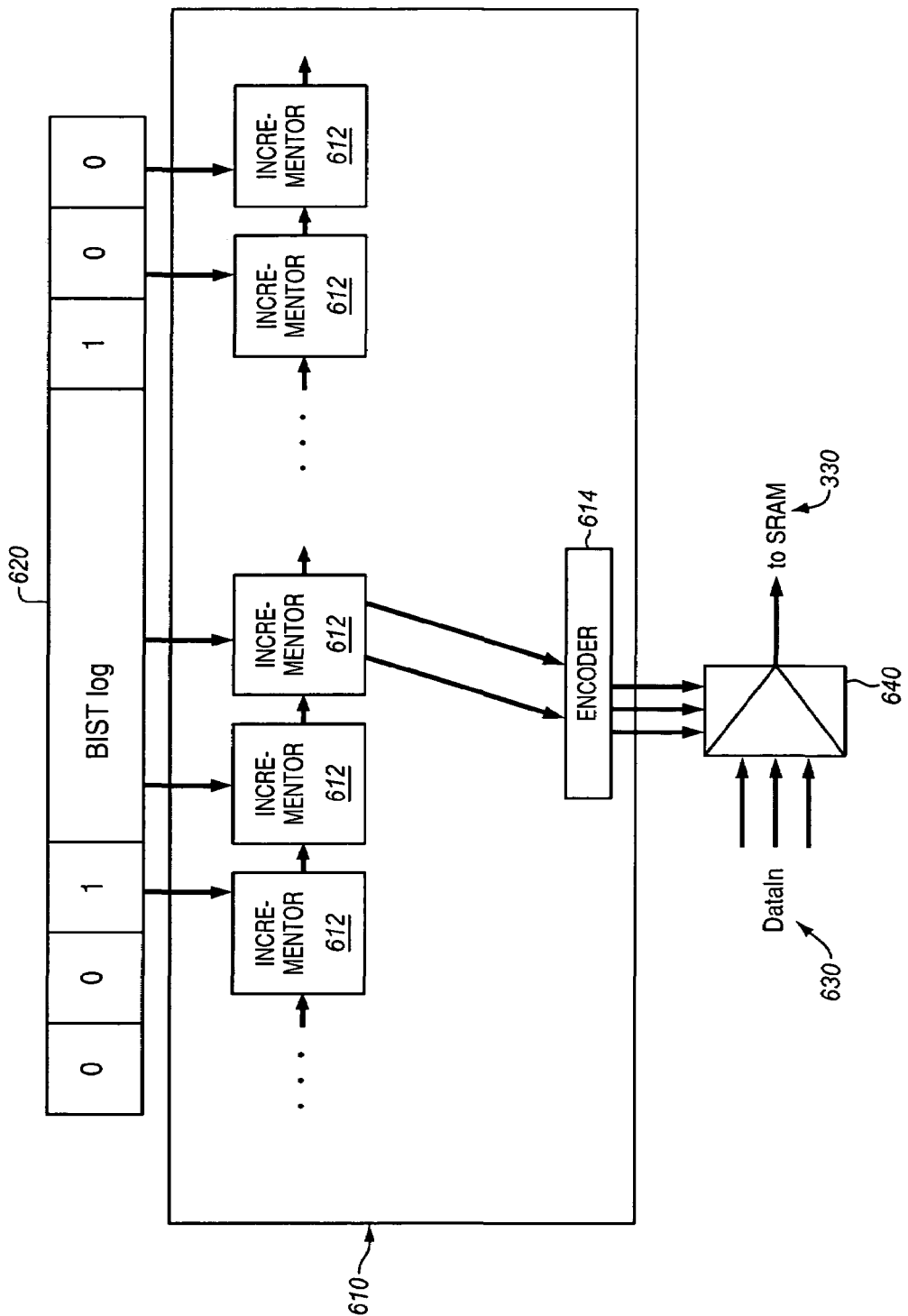
FIG. 6 illustrates a block diagram of one embodiment of redundancy configuration logic for an input shifter.
Figure 7:
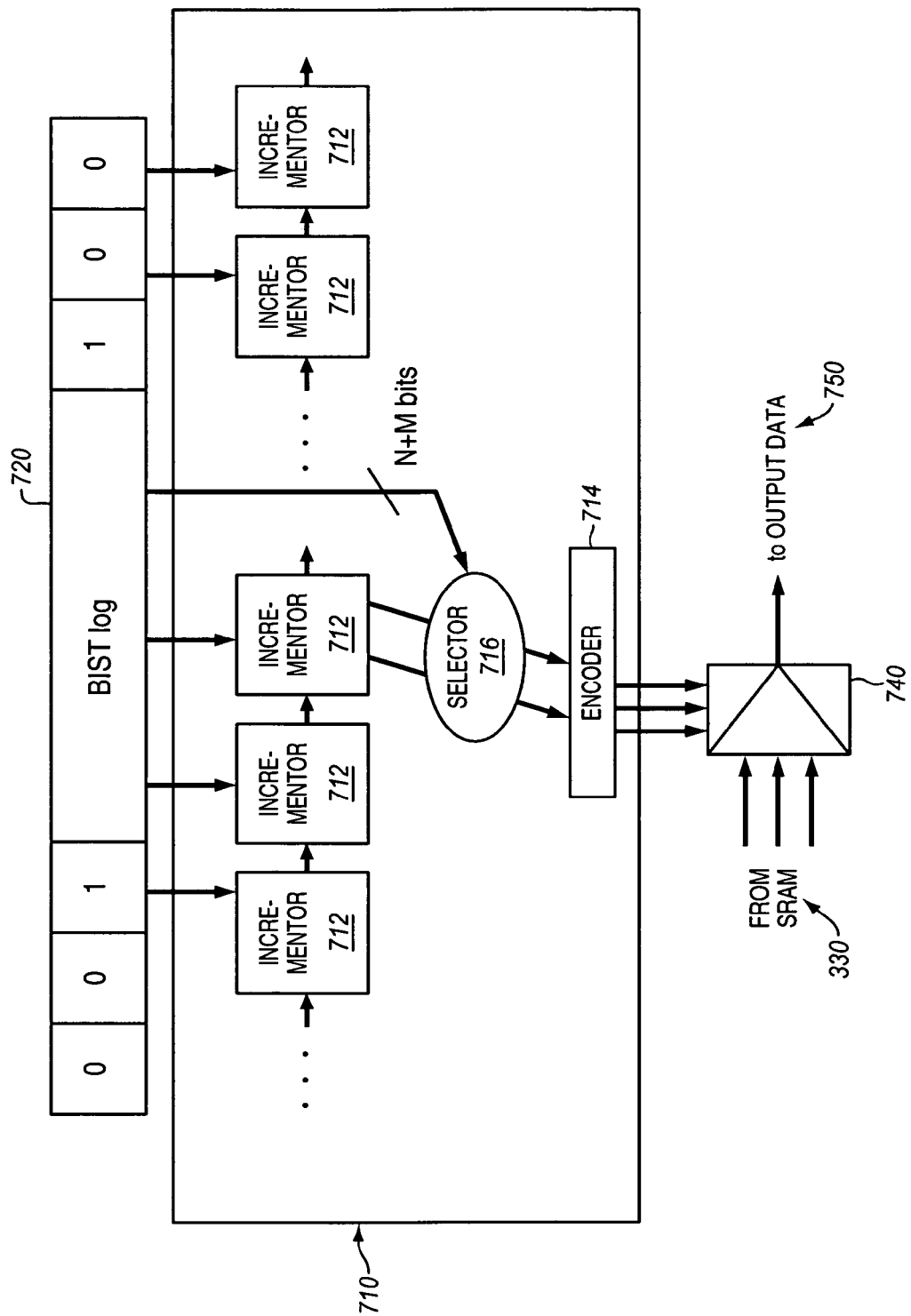
FIG. 7 illustrates a block diagram of one embodiment of redundancy configuration logic for an output shifter.

Referring to FIGS. 6 and 7, block diagrams depicting embodiments of redundancy configuration logic are shown. Redundancy configuration logic is combinatorial logic that generates one or more select signals for multiplexers of the input and output shifters. In some embodiments, the select signals generated by redundancy configuration logic may include in their paths repeaters forming quasi-combinatorial logic, due to timing reasons.

FIG. 6 illustrates one embodiment of the structure of redundancy configuration logic 610 for an input shifter. The length of the BIST log 620 equals the number of multiplexers in the input shifter. In one embodiment, the BIST log 620 may be a register to store the data representing faulty columns (e.g., "0" and "1" values) of the SRAM 330. For ease of illustration, only one input shifter multiplexer 640 is shown. However, an input shifter may comprise more than one multiplexer.

In one exemplary embodiment, the BIST log 620 contains vector 0 1 0 0 1 0 0, and the multiplexer 640 of input shifter has a fan-in value of M+1=3. Redundancy configuration logic 610 contains incrementors 612 that increment the vector value when a '1' (or any other indicator utilized) is encountered in the BIST log 620. The incrementors output the sequence of values, 0 1 1 1 2 2 2, based on the BIST log 620 vector. The output of the incrementors 612 is passed to encoder 614. The encoder 614 encodes select signals from the sequence of values outputted by the incrementors 612. The multiplexer 640 of input shifter utilizes those select signals to determine which column of SRAM 330 to send input data 630.

FIG. 7 illustrates one embodiment of the structure of redundancy configuration logic for an output shifter. For ease of illustration, only one output shifter multiplexer 740 is shown. However, it should be noted that an output shifter may comprise more than one multiplexer.

The redundancy configuration logic 710 structure for output shifter is similar to the structure of redundancy configuration logic 610 for input shifter, as depicted in FIG. 6. However, redundancy configuration logic 710 for output shifter contains one more level of logic than redundancy configuration logic 610 for input shifter. The additional level of logic is selector 716.

Selector 716 selects signals that are not marked or indicated by the BIST log 720 to be invalid. As the length of BIST log 720 is N+M and is greater than the number of multiplexers 740 in the output shifter, the selection by selector 716 reduces the size of the output data 750 to the correct length of N bits. For example, if BIST log 720 contains vector 0 1 0 0 1 0 0, then the set of signals generated by incrementor 712 for encoding by encoder 714 is 0 1 1 1 2 2 2. From this set of signals, the second and fifth entry are eliminated by selector 716, leaving the set of values for encoding by encoder 714 to be 0 1 1 2 2.

Figure 8:
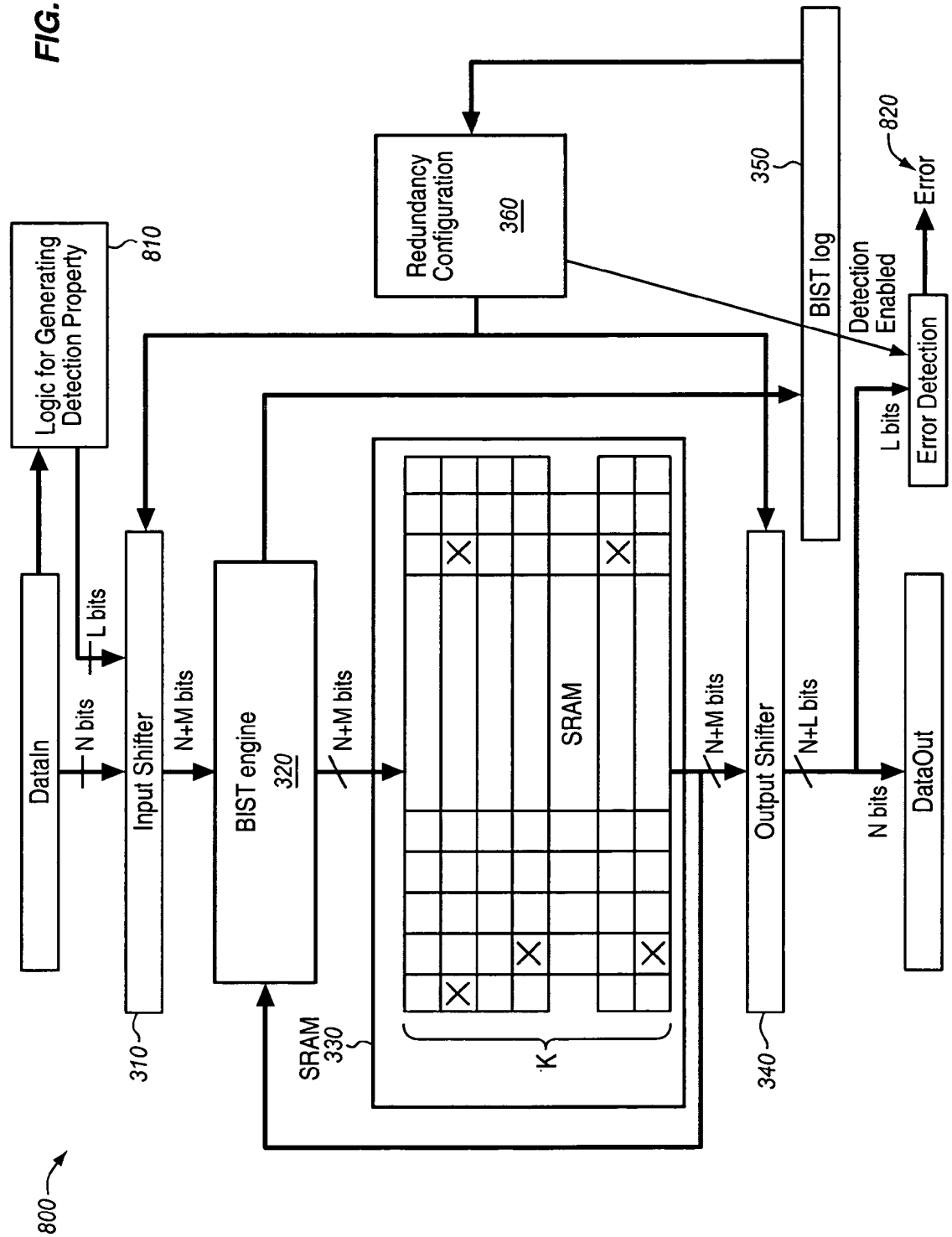
FIG. 8 illustrates a block diagram an alternative embodiment of an SRAM with redundancy and error detection logic.

Referring to FIG. 8, a further embodiment is shown. This embodiment includes the SRAM 330 configured to use redundancy configuration logic 360 for processing of the BIST log 350 to enable redundancy, as described above with respect to FIGS. 3 through 7. The embodiment further includes the additional feature of utilizing one or more spare redundancy columns of SRAM 330 for error detection logic 820.

The implementation 800 of the SRAM 330 may be upgraded to include error detection capabilities utilizing spare redundancy columns, as shown in FIG. 8. Adding logic for error detection reinforces the masking capability of the system in which the redundant SRAM 330 resides. SRAM 330, in this embodiment, may utilize one or more of its M spare redundant columns if N+L of N+M columns function properly, where L is the number of spare columns being utilized for error detection.

Error detection capabilities may be implemented by using logic 810 for generating an error detection capability at the input shifter 310 level in order to designate the L columns for error detection. At the output shifter 340 level, N+L bits of the N+M bits coming out of SRAM 330 are selected to be output. The L bits for error detection are then passed on to error detection logic 820 to determine whether there has been an error in SRAM 330.

In some embodiments, parity may be utilized for the error detection functionality. However, embodiments are not limited to such an implementation. In other embodiments, the spare redundancy columns may be used for error correction, such as utilizing Error Correction Code (ECC) or replicating the most sensitive bits (e.g., replicating "valid bits").

In some embodiments, redundancy may be used in SRAM to mask failures related specifically to low power voltage. In such a situation, due to the infrequent occurrence of errors, a minimal number of SRAM bits will likely be masked. As a result, many spare redundant columns of the SRAM allotted for failure masking may be unused.

In such a case, these unused spare columns may be used for error detection, as described above, so that no undetected "weak bits" may exist in the SRAMs. If unmasked failures begin to occur, redundancy may be reconfigured in the SRAM, and the number of failure masking redundant columns may increase at the expense of the error detection spare columns.

Figure 9:
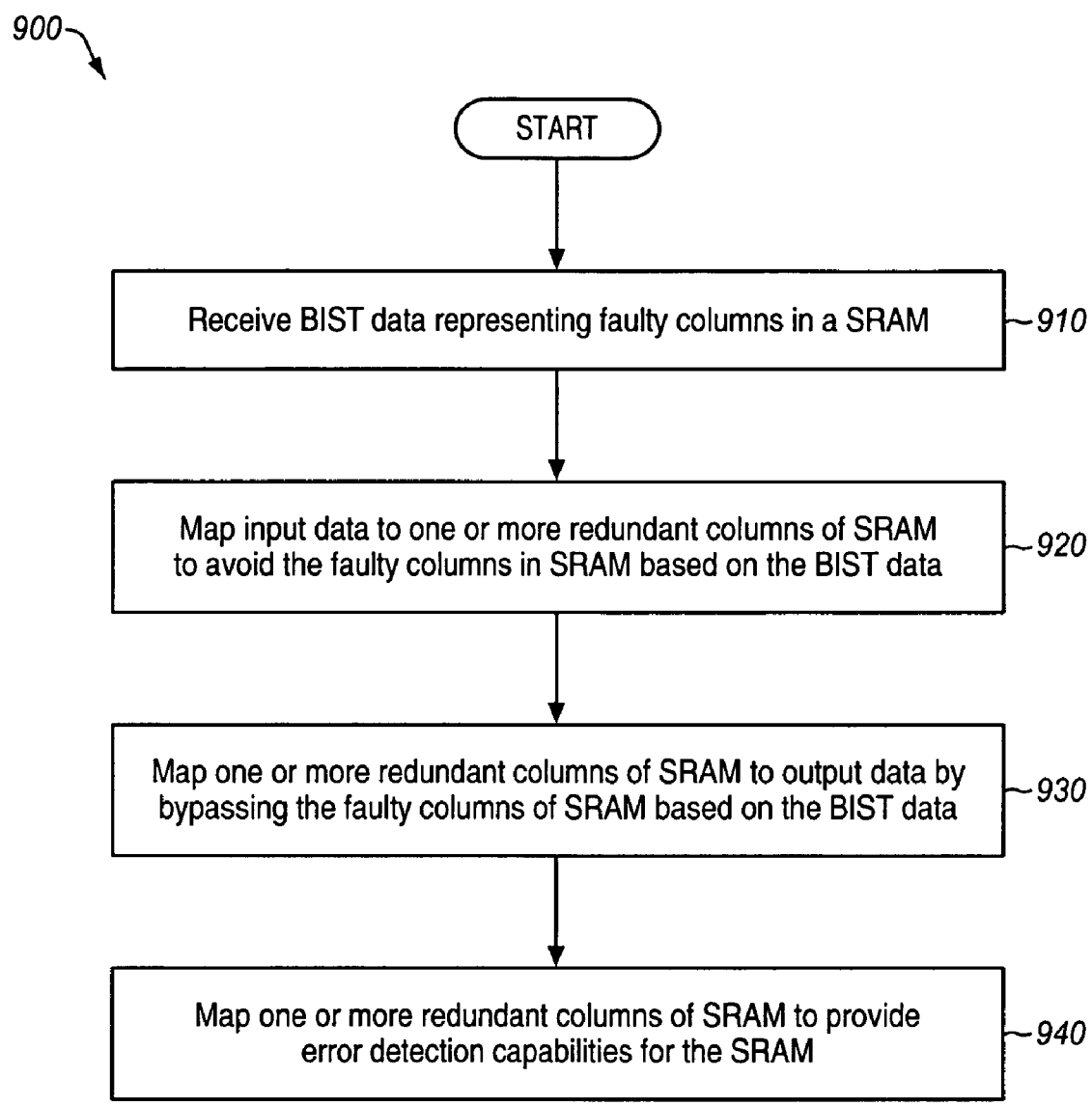
FIG. 9 illustrates a flow diagram of a method according to one embodiment of the invention.

FIG. 9 is a flow diagram of one embodiment of a process for implementing redundancy to mask failures in an SRAM. The process 900 is performed by an SRAM implementing redundancy, such as those depicted in FIGS. 3 and 8. At processing block 910, redundancy configuration logic receives BIST data representing faulty columns in a SRAM. Then, at processing block 920, an input shifter maps input data to one or more redundant columns of SRAM to avoid storing the input data to the faulty columns of SRAM as determined based on the BIST data. At processing block 930, output shifter maps the redundant columns of the SRAM to output data by bypassing the faulty columns of SRAM determined based on the BIST data. Finally, at processing block 940, input shifter maps one or more redundant columns of the SRAM to provide error detection capabilities for the SRAM.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. An apparatus, comprising:
 a built-in self test (BIST) log to store BIST data representing faulty columns of a memory;
 redundancy configuration logic to receive a sequence of vector values from the BIST indicating one or more faulty columns, including:
  one or more incrementors to increment the vector values upon each indication of a faulty column; and
  an encoder to encode the incremented values received from the incrementors into one or more select signals;
 an input shifter to map input data to one or more redundant columns of the memory, based on the one or more select signals received from the redundancy configuration logic, to avoid storing the input data to the faulty columns of the memory; and
 an output shifter to map output data from the one or more redundant columns of the memory, based on the one or more select signals, by bypassing the faulty columns.

2. The apparatus of claim 1, wherein the memory is a static random access memory (SRAM).

3. The apparatus of claim 1, wherein a column in the memory is faulty if any bit in the column is faulty.

4. The apparatus of claim 3, wherein the input shifter and the output shifter comprise one or more multiplexers.

5. The apparatus of claim 3, wherein the BIST log comprises a register to store the BIST data representing the faulty columns of the memory.

6. The apparatus of claim 1, further comprising a BIST engine to test the memory for faulty bits and provide the BIST log with the BIST data representing the faulty columns of the memory.

7. The apparatus of claim 1, further comprising a selector to select the data from the incrementors to supply to the encoder.

8. The apparatus of claim 1, wherein one or more redundant columns are used for error detection logic.

9. The apparatus of claim 8, where the error detection logic utilizes parity to detect errors.

10. A method, comprising:
 receiving a sequence of vector values from a built-in self test (BIST) indicating one or more faulty columns in a memory;
 incrementing the vector values upon each indication of a faulty column;
 encoding the incremented values into one or more select signals;
 mapping input data to one or more redundant columns of the memory based upon the select signals to avoid the faulty columns of the memory; and
 mapping the redundant columns of the memory to output data by bypassing the faulty columns of the memory.

11. The method of claim 10, wherein the memory is a static random access memory (SRAM).

12. The method of claim 10, wherein a column in the memory is faulty if any bit in the column is faulty.

13. The method of claim 10, wherein mapping input data to one or more redundant columns of the memory is performed by a multiplexer receiving select signals based on the BIST data.

14. The method of claim 10, further comprising mapping one or more redundant columns of the memory to provide error detection capabilities for the memory.

15. A system, comprising:
 a controller hub;
 a processor coupled to the controller hub including a memory controller to control a memory; and
 logic to configure the memory, including:
  a built-in self test (BIST) log to store BIST data representing faulty columns of a memory;
  redundancy configuration logic to receive a sequence of vector values from the BIST indicating one or more faulty values, including:
   one or more incrementors to increment the vector values upon each indication of a faulty column; and
   an encoder to encode the incremented values received from the incrementors into one or more select signals;
  an input shifter to map input data to one or mote redundant columns of the memory, based on the one or more select signals received from the redundancy configuration logic, to avoid storing the input data to the faulty columns of the memory; and
  an output shifter to map output data from the one or more redundant columns of the memory, based on the one or more select signals, by bypassing the faulty columns.

16. The system of claim 15, wherein the memory is a static random access memory (SRAM).

17. The system of claim 15, wherein a column in the memory is faulty if any bit in the column is faulty.

18. The system of claim 15, wherein the input shifter and the output shifter comprise one or more multiplexers.

19. The system of claim 15, wherein one or more redundant columns are used for error detection logic.

* * * * *